(12) United States Patent
Tsironis

(10) Patent No.: US 10,187,228 B1
(45) Date of Patent: Jan. 22, 2019

(54) INTEGRATED SPLIT SIGNAL HYBRID HARMONIC TUNER

(71) Applicant: Christos Tsironis, Dollard-des-Ormeaux (CA)

(72) Inventor: Christos Tsironis, Dollard-des-Ormeaux (CA)

( * ) Notice: Subject to any disclaimer, the term of this patent is extended or adjusted under 35 U.S.C. 154(b) by 0 days.

(21) Appl. No.: 15/988,212

(22) Filed: May 24, 2018

Related U.S. Application Data

(60) Provisional application No. 62/510,570, filed on May 24, 2017.

(51) Int. Cl.
| | | |
|---|---|---|
| H03H 7/38 | (2006.01) | |
| H04L 25/02 | (2006.01) | |
| H01P 5/04 | (2006.01) | |
| G01R 31/28 | (2006.01) | |
| G01R 31/26 | (2014.01) | |
| H03J 1/06 | (2006.01) | |

(52) U.S. Cl.
CPC ...... *H04L 25/0278* (2013.01); *G01R 31/2612* (2013.01); *G01R 31/2614* (2013.01); *G01R 31/2822* (2013.01); *H01P 5/04* (2013.01); *H03J 1/06* (2013.01)

(58) Field of Classification Search
CPC ............ H03H 7/38; H03H 7/383; H03H 7/40; H03H 2009/02; H03H 2009/02165; H04L 25/00; H04L 25/02; H04L 25/0264; H04L 25/0278; H04L 25/0298; H01P 5/04; H03J 1/06
See application file for complete search history.

(56) References Cited

U.S. PATENT DOCUMENTS

| | | | |
|---|---|---|---|
| 5,034,708 A | 7/1991 | Adamian et al. | |
| 6,674,293 B1 | 1/2004 | Tsironis | |
| 7,034,629 B2 | 4/2006 | Tsironis | |
| 7,282,926 B1 * | 10/2007 | Verspecht | G01R 27/32 |
| | | | 324/637 |

(Continued)

OTHER PUBLICATIONS

"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.

(Continued)

*Primary Examiner* — Jason Crawford

(57) ABSTRACT

An integrated hybrid (active-passive) harmonic impedance tuner uses a fixed and an adjustable directional coupler (wave-probe) and a number of independent wideband tuning probes, all mounted inside the same slabline and housing. The tuning probes are inserted between the fixed and the mobile wave-probes. The fixed wave-probe samples a portion of the forward travelling signal at the fundamental frequency, injects it into a power amplifier and the mobile wave-probe adjusts the phase and amplitude of the amplified signal and injects it back into the slabline towards the DUT. The mobile carriages and tuning probes are automated. The mobile wave-probe is either fully or partially (horizontal only) automated or fully manually controlled. Feedback signal phase and amplitude control is obtained through the horizontal and vertical movement of the mobile wave-probe.

7 Claims, 10 Drawing Sheets

(56) References Cited

U.S. PATENT DOCUMENTS

| | | | | |
|---|---|---|---|---|
| 8,466,758 B1* | 6/2013 | Tsironis | .................... | H01P 5/04 |
| | | | | 333/17.3 |
| 9,148,127 B1* | 9/2015 | Lee | ......................... | H03H 7/40 |
| 9,331,670 B1 | 5/2016 | Essing | | |
| 9,625,556 B1 | 5/2017 | Tsironis | | |
| 9,960,472 B1* | 5/2018 | Tsironis | .................... | H01P 5/04 |
| 2013/0321092 A1* | 12/2013 | Simpson | ................ | H03H 11/30 |
| | | | | 333/17.3 |

OTHER PUBLICATIONS

"Active Load Pull System, ALPS", Product Note 33, Focus Microwaves, 1966, p. 3, Figure 3.

"Computer-Aided Error Correction of Large-Signal Load-Pull Measurements", Tucker, R.S. and BR Adley P., [online], IEEE Transactions on Microwave Theory and Techniques, vol. MTT-32, No. 3, Mar. 1984, pp. 296-300. [Retrieved Apr. 6, 2017]. Retrieved from Internet <URL:http://ieeexplore.ieee.org/document/1132668/>.

"Comparison of Active Versus Passive On-wafer Load-pull Characterization of Microwave and Millimeter-wave Power Devices," J. E. Muller and B. Gyselinckx,1994 IEEE MTT-S Digest, CH3389-4/94/0000-007$01.00, pp. 1007-1080, Figure 1, [Retrieved Apr. 6, 2017]. Retrieved from Internet < URL: http://ieeexplore.ieee.org/iel5/1100/7886/00335168.pdf>.

"MPT, a Universal Multi-Purpose Tuner, Product Note 79", Focus Microwaves Inc., Oct. 2004.

D. Blackham, K. Wong, "Multi Port Measurement," Agilent Technologies Presentation, pp. 3-8.

\* cited by examiner

INTEGRATED SPLIT SIGNAL HYBRID HARMONIC TUNER

PRIORITY CLAIM

This application claims priority on provisional application 62/510,570, titled: "Integrated split signal hybrid harmonic tuner", filed on May 24, 2017.

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
2. "Active Load Pull System, ALPS", Product Note 33, Focus Microwaves, 1966, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved 2017 Apr. 6]. Retrieved from Internet <URL:http://ieeexplore.ieee.org/document/1132668/>
4. "Comparison of Active Versus Passive On-wafer Load-pull Characterization of Microwave and Millimeter-wave Power Devices," J. E. Muller and B. Gyselinckx, 1994 IEEE MTT-S Digest, CH3389-4/94/0000-007$01.00, pp 1007-1080, FIG. 1, [Retrieved 2017 Apr. 6]. Retrieved from Internet <URL: http://ieeexplore.ieee.org/ie15/1100/7886/00335168.pdf>.
5. Adamian et al., U.S. Pat. No. 5,034,708, "Programmable broadband electronic tuner".
6. Jacobus A. J. Essing, U.S. Pat. No. 9,331,670, "Gamma Boosting Unit (GBU) for Hybrid Load and Source Pull".
7. "MPT, a Universal Multi-Purpose Tuner, Product Note 79", Focus Microwaves Inc., October 2004.
8. D. Blackham, K. Wong, "Multi Port Measurement," Agilent Technologies Presentation, Pages 3-8.
9. Verspecht et al., U.S. Pat. No. 7,282,926 "Method and an apparatus for characterizing a high-frequency device-under-test in a large signal impedance tuning environment".
10. Tsironis C., U.S. Pat. No. 6,674,293, "Adaptable Pre-matched Tuner System and Method".
11. Tsironis C., U.S. Pat. No. 7,034,629, "High Frequency, High Reflection Pre-matching Tuners with Variable Zero Initialization".
12. Tsironis C., U.S. Pat. No. 9,625,556, "Method for Calibration and Tuning with Impedance Tuners".

BACKGROUND OF THE INVENTION

This invention relates to high power testing of microwave transistors (DUT) in nonlinear operation, especially, but not only, where harmonic signal components are generated and must be processed. When the transistor is driven in its nonlinear operation regime, the internal impedance at the output of power transistors is very low. An impedance tuner used to match the transistor must also physically conjugate match such impedance. Passive impedance tuners can reach maximum reflection factors $|\Gamma_{tuner}|$ of the order of 0.95, corresponding to smallest impedances of 2.4 Ohm. The insertion loss of the RF connection between DUT and tuner reduces this available tuning range at the DUT reference plane and thus the capacity of the passive tuner to match the transistor. The only remedy to this limitation is using active systems, i.e. test systems whereby a signal coherent with the signal departing from the DUT, is returned and re-injected independently into the DUT output and creates a virtual (not a physical) load. This additional signal can be the only one injected, in which case we speak of "active" or "purely active" load pull, or it can be superimposed to signal physically reflected by a passive tuner, in which case we speak of "hybrid" load pull; obviously if only a mechanical or electronic (PIN diode based, see ref. 5) tuner is present, we speak of "passive" load pull. In both pure active and hybrid load pull cases the objective is reaching and conjugate complex matching the internal impedance of the DUT (transistor); in general terms a standard requirement is a dynamic range reaching a reflection factor $|\Gamma|=1$ (corresponding to the real part R of 0 Ohm ($\Omega$) of the associated impedance $Z=R+jX$). The objective of this invention is a compact hybrid tuner apparatus, combining an internal forward signal sampling and active feedback injection mechanism within a single tuner housing architecture, allowing $|\Gamma|=1$. Harmonic signal components are also processed (matched with proper loads) using only the passive harmonic tuner capability.

The typical prior art test active injection system is shown in FIG. 1: In this prior art hybrid (=active/passive) test setup the signal source of the four-port vector receiver 24 (VNA), injects signal 25 into the DUT 21 via a source impedance tuner 23 and a bidirectional coupler 11. Similar to ref. 6, the outgoing signal travels through a second bidirectional coupler 10 and a load impedance tuner 20 to a directional coupler 26, which allows injecting signal power 27 from a second, independently controllable, but synchronized with the first, source of the VNA towards the DUT. The signal path terminates with characteristic impedance Zo 19, typically 50$\Omega$. The commonly designated injected (<a>) and reflected (<b>) power waves from and into the DUT ports (<a1> into- and <b1> from-the input port and <a2> into- and <b2> from-the output port) are measured by the VNA 24, after being sampled by the couplers 10 and 11. The tuners and instruments are controlled using data communication cables 18 and 17 by a system controller 22 running appropriate test software.

DESCRIPTION OF PRIOR ART

Over time there have been several attempts to active load pull systems, starting back in the 70'ies (see ref. 1 to 4). Such load pull techniques employ exclusively the "virtual load" method. The virtual load method consists in injecting into the output of the DUT signal power at the same RF frequency as traversing the DUT from the input to the output, but with controlled phase and amplitude. Knowing that the reflection factor "seen" by the DUT at its output port is equal to the ratio of returned (reflected) signal power wave <a2> to the primary output signal power wave <b2>: ($\Gamma$=<a2>/<b2>), it is obvious that by controlling the phase and amplitude of <a2> we can control $\Gamma$. There are a number of ways to do this:

(a) One is to use an "active load" technique (see ref. 2). In this case part of the outgoing power $P_{out}$ is diverted into the coupled port of a directional coupler, filtered, phase adjusted, amplified and re-injected into the output port of the DUT, which will "see" a complex load $\Gamma=|\Gamma|*\exp(j\Phi)$ as described above.

(b) Another method is to split the source signal (see ref. 1) or use two synchronized RF sources (see ref. 3) one to inject RF power into the input of the DUT and one into its output.

Since the two sources are synchronized, they can generate a coherent signal and if we adjust the relative phases between sources and the amplitude of the feedback injected second source, then the DUT will, again, see at its output port a "virtual" load T, as described earlier.

In this invention we use the principle of case (a), albeit in combination with a passive pre-matching tuner to reduce feedback power and with adjustable signal couplers (wave probes, see ref. 9) to replace band limited and complex amplitude and phase controllers.

BRIEF DESCRIPTION OF THE INVENTION

The distinct novelties of this invention (FIG. 9) relative to prior art are:

a) The RF apparatus is inherently wideband, covering several RF frequency octaves (limited only by the bandwidth of the amplifier, which is an external accessory).

b) Active and passive sections are integrated in the same low loss slotted transmission line (slabline), ensuring compactness, transportability and the lowest possible insertion loss between the two sections.

c) Using integrated, ultra-wideband (FIG. 3), compact (FIG. 2), adjustable (FIG. 4) directional couplers (wave-probes) 61, 62 (FIG. 6) which replace external band-limited and cumbersome variable attenuators and phase shifters (FIG. 2 in ref. 1).

d) Using a multi carriage harmonic tuner (FIGS. 6, 7B, 7C and 9), allows the benefits of pre-matching at the fundamental frequency Fo for reducing amplifier power and simultaneous passive harmonic tuning (adjusting the impedances at the harmonic frequencies independently).

e) Feed-forward signal split before the passive tuning section 606 and reverse injection 62 after the passive harmonic tuner section, avoids weakening the reflected fundamental (Fo) signal by the insertion loss of the passive tuner in reverse signal travelling direction.

f) Strong reverse 62 coupling (C2) of the feedback injected power after the passive tuner section 606 is possible without wasting useful signal strength at Fo by the coupler 62 and reduces the requirement for high value amplifier power without affecting the passive reflection factor $\Gamma_T$ (FIGS. 6 and 9), since $\Gamma_{load} \approx 0$.

In more detail (FIG. 9), the portion <C1*b> of the signal <b> coming out of the DUT is coupled into the input port of the amplifier (FIG. 9) using a fixed wave-probe #1. At the fundamental frequency Fo, the amplified signal <G*b*C1> coming out of the amplifier is injected into the slabline in reverse direction (towards the DUT, which is connected to the test port), using an adjustable directional coupler (wave-probe #2) with variable coupling factor C2; the reverse injected signal <b*G*C1*C2> is synchronous and can be adjusted, by moving wave-probe #2 horizontally, to be optimally "in-phase" with the primary returned signal <b* $(1-C1)*\sigma_T$>, which is reflected at the passive tuner $\Gamma_T$ (Fo) back into the output port of the DUT. The present implementation of the amplitude and phase adjustable second coupler (C2) eliminates the need of both the adjustable phase shifter and attenuator in prior art configurations (see ref. 1, FIG. 2), which in those prior art cases are an important hardware limitation (cumbersome and frequency band limited); this allows for a better, simpler and more effective solution and permits integrating with an impedance tuner in the same slabline with minimum insertion and transition loss, and thus minimum requirement for amplifier power. Since a multi-carriage harmonic tuner (see ref. 7) can equally be used, passive harmonic tuning, combined with power-lowering pre-matching at the fundamental frequency, is possible.

BRIEF DESCRIPTION OF THE SEVERAL VIEWS OF THE DRAWINGS

The invention and its mode of operation will be better understood from the following detailed description when read with the appended drawings in which:

FIG. 7A depicts single probe wideband (non-harmonic) hybrid tuner; FIG. 7B depicts hybrid two-probe, two-frequency (Fo and 2Fo) harmonic tuner and FIG. 7C depicts hybrid three-probe, three-frequency (Fo, 2Fo and 3Fo) harmonic tuner.

DETAILED DESCRIPTION OF THE INVENTION

The hybrid tuner uses active feedback injection at the fundamental frequency Fo only. The passive tuner can tune at Fo, if it comprises a single RF tuning probe, or independently at 2Fo and/or 3Fo if it comprises two or three RF tuning probes. This is known from prior art (see ref. 12). Tuning at Fo in fact acts as pre-matching and injected power reduction, whereas tuning at 2Fo and 3Fo is just that, independent passive tuning.

Figure 1:
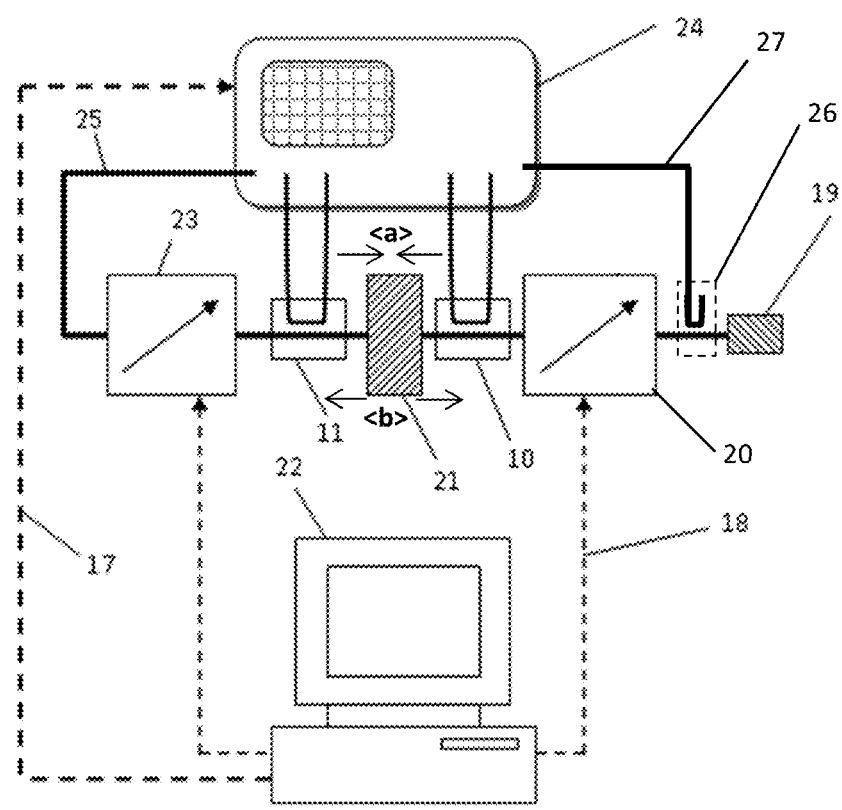
FIG. 1 depicts prior art, a hybrid load pull system allowing measuring injected and reflected power waves and harmonic signal components.
Figure 2:
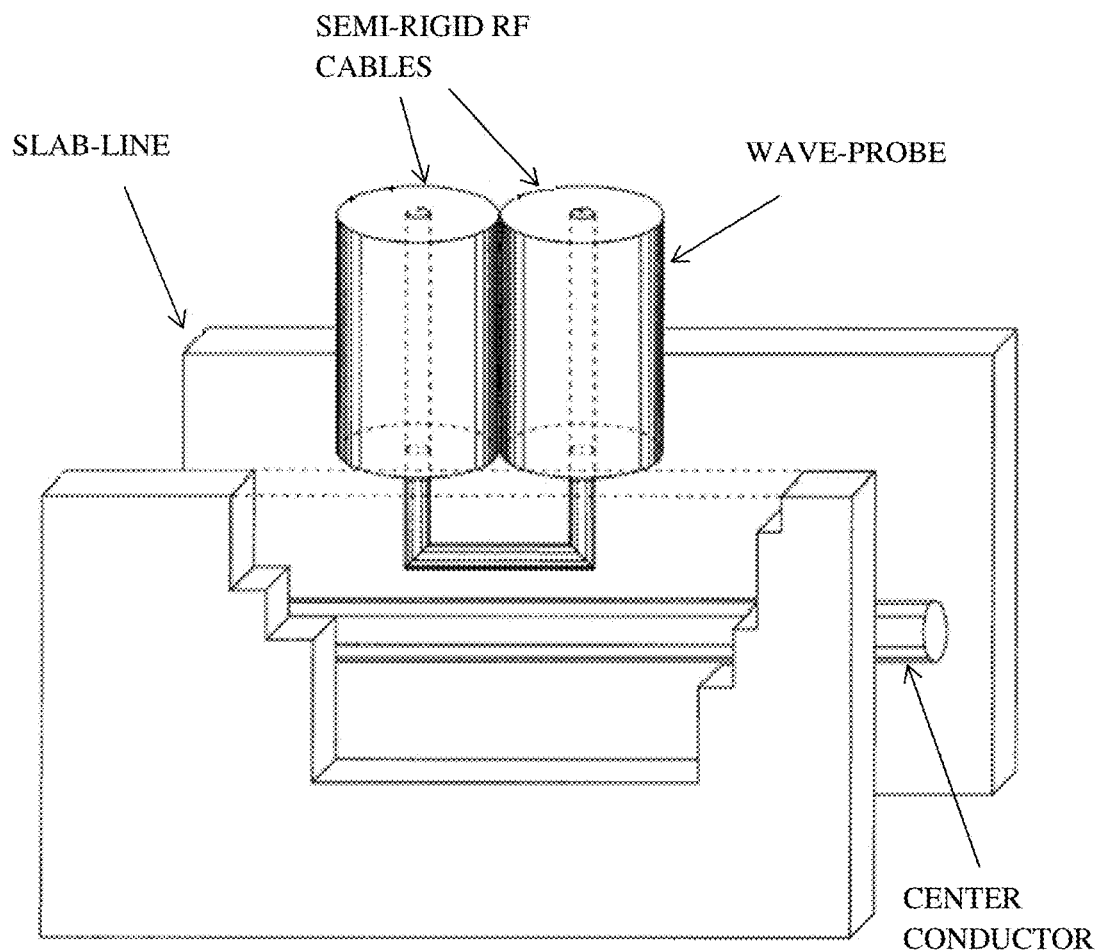
FIG. 2 depicts prior art, the compact signal coupler made using a locally denuded and folded semi-rigid coaxial cable ("wave-probe", see ref. 9).
Figure 4:
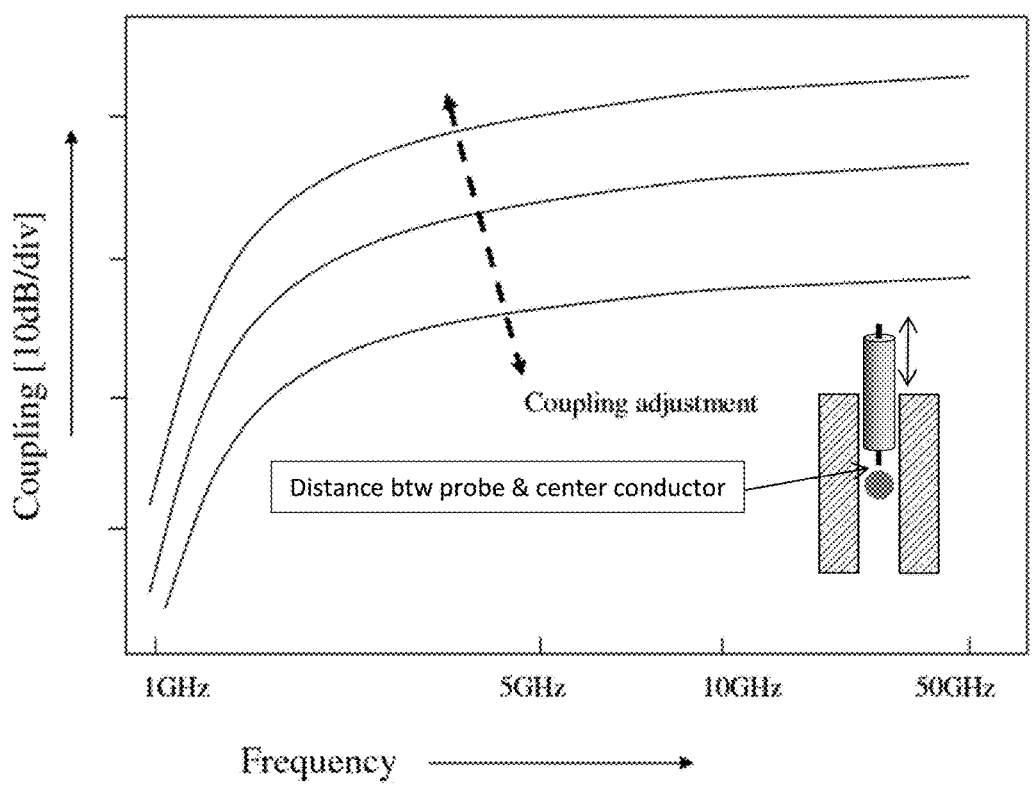
FIG. 4 depicts prior art, variation of coupling factor as a function of the proximity of coupling loop of the wave-probe to the center conductor (probe depth) and frequency.
Figure 5:
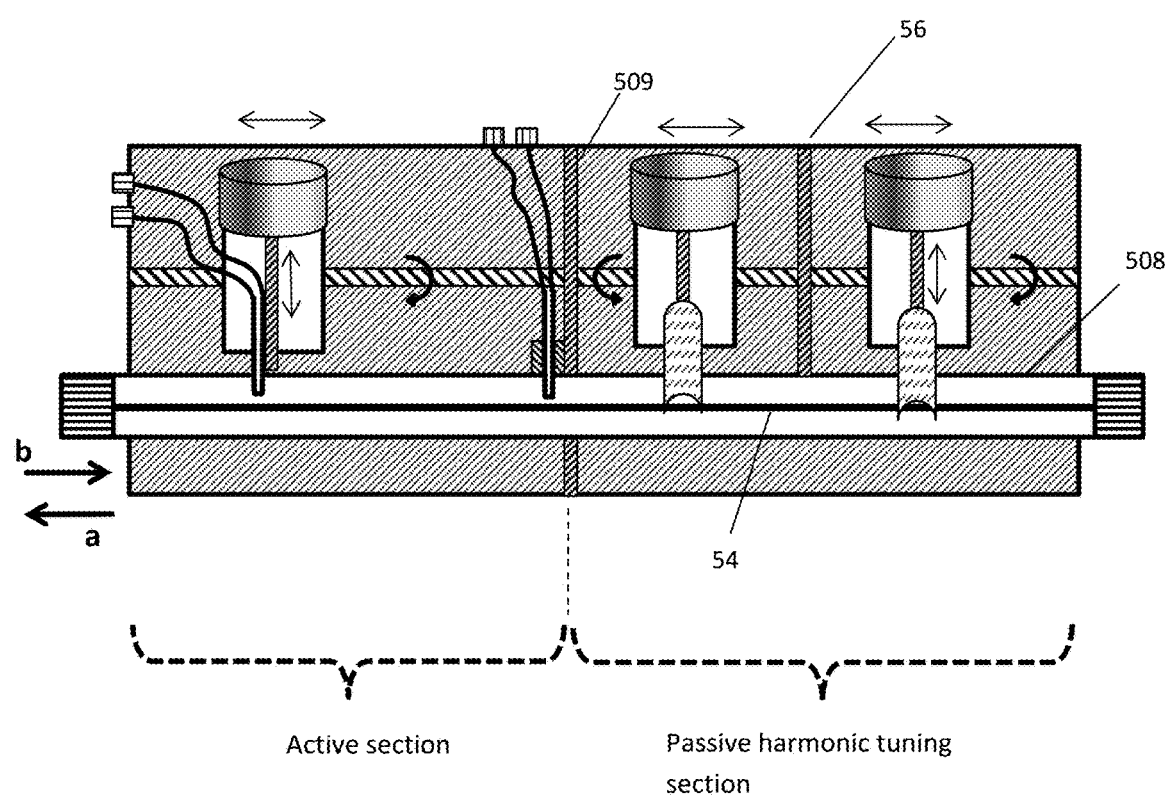
FIG. 5 depicts front view of a possible embodiment of integrated hybrid (active-passive) harmonic tuner using variable and fixed wave-probe couplers and two mobile tuning probes inside the same slabline, whereby the reverse injecting coupler is placed before the passive harmonic tuning section.

The concept of the RF/microwave integrated hybrid wideband and harmonic impedance tuner is shown in a number of embodiments in FIGS. 6, 7A, 7B and 7C. In all embodiments compact directional couplers 61, 62 the "wave-probes" (FIG. 2, see also ref. 9), are used, which are wideband, have sufficient Directivity D (the ratio S31/S32 between coupling and isolation, or the difference (in dB): D(dB)=|S31(dB)|−|S32(dB)| and can be easily fixed either on the housing of the tuner, 60, or on the vertical axis of a tuner carriage, 62; in that second case the wave-probe replaces a reflective tuning probe 63; by approaching the wave-probe to the center conductor 64 from the top, the coupling factor can be adjusted (FIG. 4). The mobile carriages 65, 66, 67 have adjustable vertical axes 68, controlled by stepper motors 69, which carry either reflective probes 63 or the wave-probe 62. The first wave-probe 61 is placed horizontally permanently closest to the test port; the second wave-probe 62 is mounted on the vertical axis of the mobile carriage which is placed between the idle port and the last mobile tuning carriage, in this case 66, and can move along the slabline over one wavelength (λ) at the test frequency Fo. The isolated ports of the wave-probes are terminated with characteristic impedance (Zo). The passive tuner comprises one, two or three (FIGS. 7A through 7C) mobile tuning carriages holding wideband reflective (tuning) probes 63; the probes are attached to the vertical axes and their penetration between the two conductive sidewalls of the low loss slabline 508 and capacitive coupling with the center conductor 54, 64, is controlled using stepper motors 69. All carriages are controlled horizontally independently from each-other using lead screws 601 or other gear, like belts or rack-and-pinion mechanism and additional stepper motors, a technique known from prior art (see ref. 10) and not shown herein in more detail. Two wideband tuning probes each mounted on a different carriage allow independent tuning at two frequencies (harmonic or not) and three probes mounted on three carriages control three frequencies (see ref. 7). The vertical separations 509, 56 in FIG. 5 indicate, symbolically, the fact that each carriage must be movable horizontally independently over a certain distance of half a wavelength and does not necessarily mean a physical separation. The predominant reason for avoiding physical separation walls is that any walls would have to be placed at a minimum distance from the test port and from each-other, corresponding to half a wavelength at the minimum frequency and thus wasting tuning range (=maximum tunable reflection factor) area at higher frequencies (see ref. 11), due to insertion loss associated with idle portions in the slabline.

Figure 6:
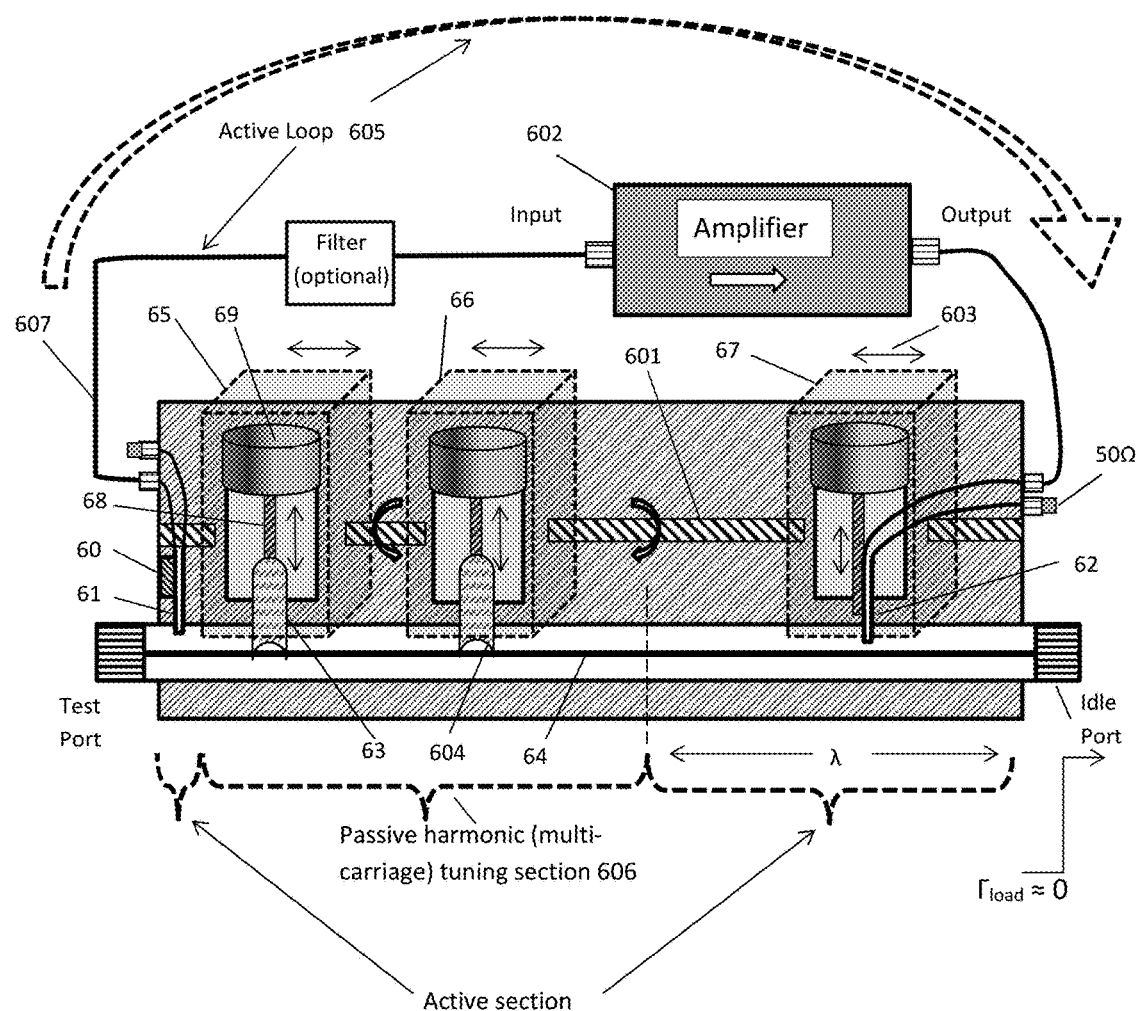
FIG. 6 depicts front view of the main embodiment of integrated hybrid harmonic tuner, whereby the fixed wave-probe #1 is closest to the test port and the variable wave-probe #2 is closest to the idle port.
Figure 7A:
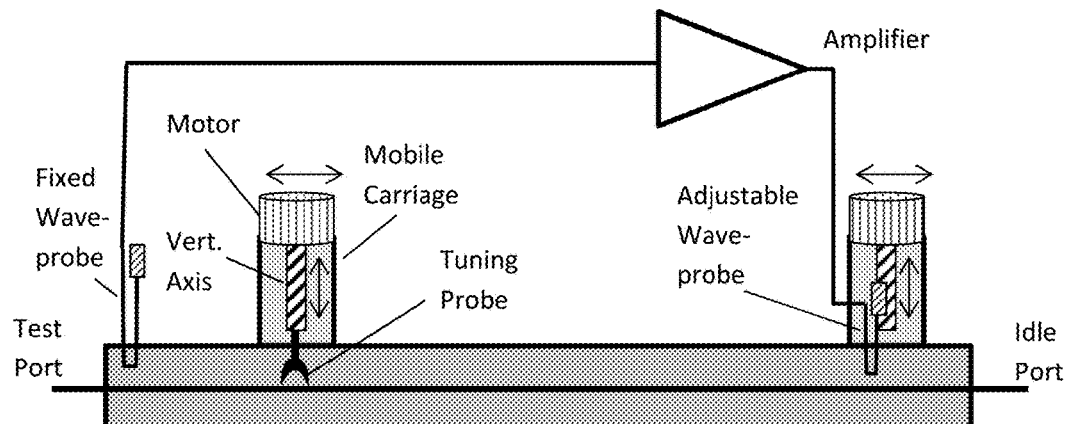
FIGS. 7A through 7C depict three possible embodiments of integrated hybrid tuner.
Figure 7B:
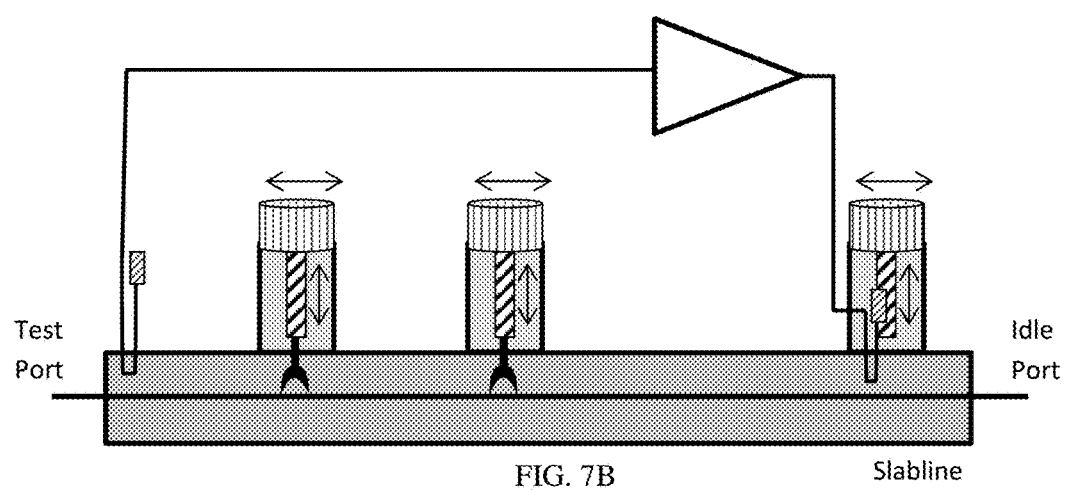
Figure 7C:
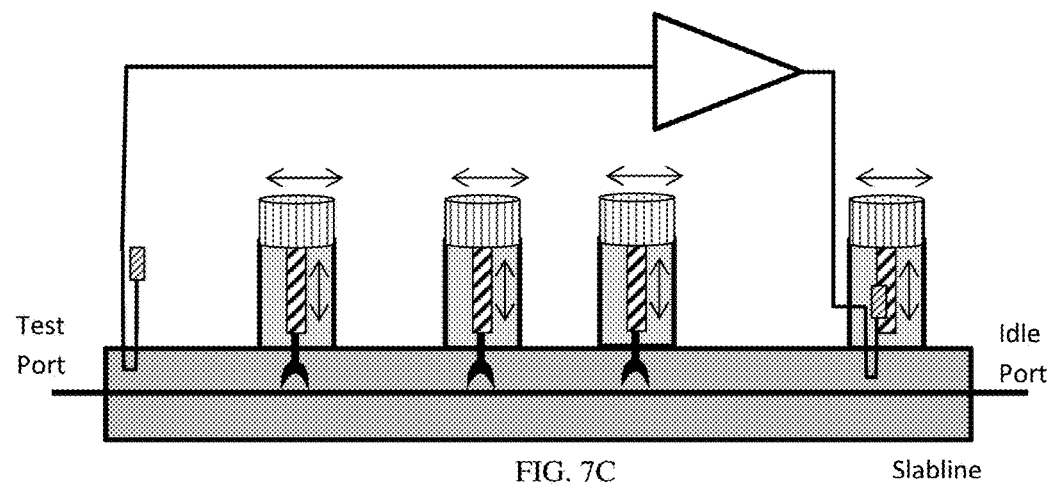

The way the hybrid tuner works is as follows: the output port of the DUT (transistor) is connected to the test port (FIG. 6). The wideband single frequency (Fo) or multiple harmonic frequency (Fo, 2Fo) or (Fo, 2Fo and 3Fo) passive tuner, comprising one, two or three independent carriages 65, 66 and reflective tuning probes 63 correspondingly, as shown in FIGS. 6 and 7A through 7C, generates independently controllable reflection factors (impedances) at the test port at each and all above mentioned frequencies. However insertion loss between the tuning probes 63 and the DUT reduces the attainable tuning range (and associated impedance range) of the tuner. Beyond using lowest loss interconnections and cables, the only remedy to boost the tuning range is to superimpose to the passive reflected signal some adjustable active signal injection. This is being done here using a set of two compact directional couplers (wave-probes #1 (61) and #2 (62)) and a power amplifier 602. The first wave-probe 61 is mounted permanently on the tuner wall using an attachment 60 closest to the test port and the second wave-probe 62 is mounted on the vertical axis of a mobile carriage 67, which moves between the last tuning carriage 66 and the idle port. Vertical control of the axis of the carriage 67 allows adjusting the coupling factor of the wave-probe 62 as shown in FIG. 4. Moving the carriage 67 horizontally 603 controls the phase of the active loop 605 and thus the phase of the amplified signal injected backwards into the slabline through the wave-probe 62. This secondary signal traverses the passive tuner section 606 towards the test port, is added to the primary, by the passive tuner reflected, signal and boosts the overall reflection factor "seen" by the DUT. The reflection factor "seen" by the DUT is therefore "hybrid", part passive and part active. The phase coupling adjustability of wave-probe 62 allows proper control of the phase and amplitude of the active injected signal, in order (a) to align the passive reflected and active injected signal vectors, and (b) not to create a reflection factor larger than the necessary to conjugate match the DUT. Excessive reflection, possibly beyond |Γ|=1 may destroy the transistor and must be avoided.

The coupled signal at wave-probe #1, 61 is injected into the input port of the amplifier 602 using RF cable 607. The amplified signal from the amplifier output port is reverse injected into the slabline using wave-probe #2, 62, in direction of the DUT. The passive tuner carriages 65, 66, including a first 63 and possibly a second 604 (or a third—not shown) tuning probes, creates power pre-matching between the wave-probe 61 and the DUT at the fundamental frequency Fo and possibly additional harmonic tuning. A single probe 63 tuner does just that, pre-matching without harmonic impedance control; a double probe tuner 63 and 604 does pre-matching at Fo and harmonic tuning at 2Fo and a triple probe tuner (FIG. 9) does pre-matching at Fo and independent harmonic tuning at 2Fo and 3Fo.

Figure 8:
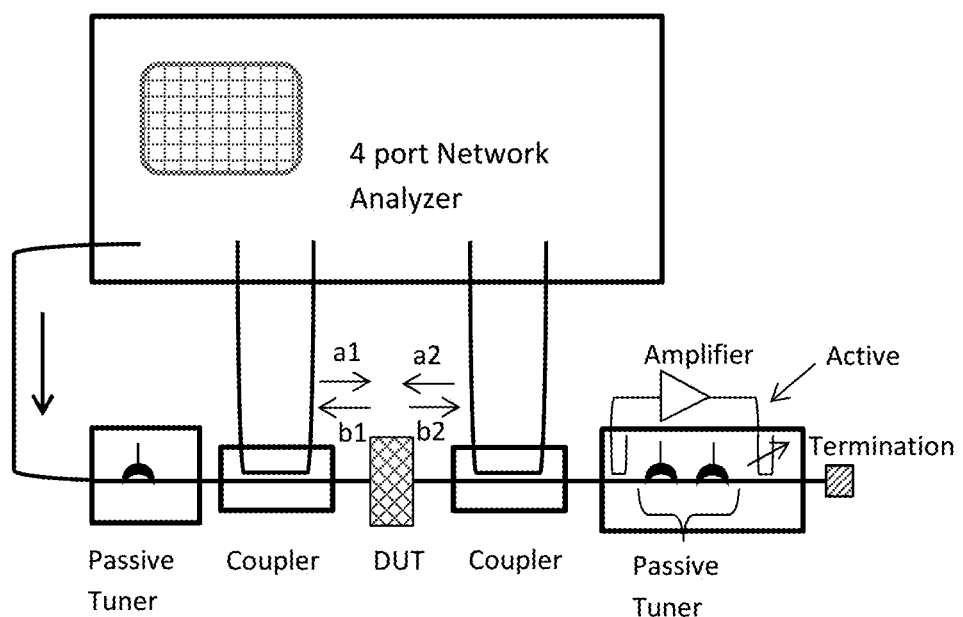
FIG. 8 depicts load pull measuring setup using integrated hybrid harmonic tuner and four-port vector network analyzer (VNA).
Figure 9:
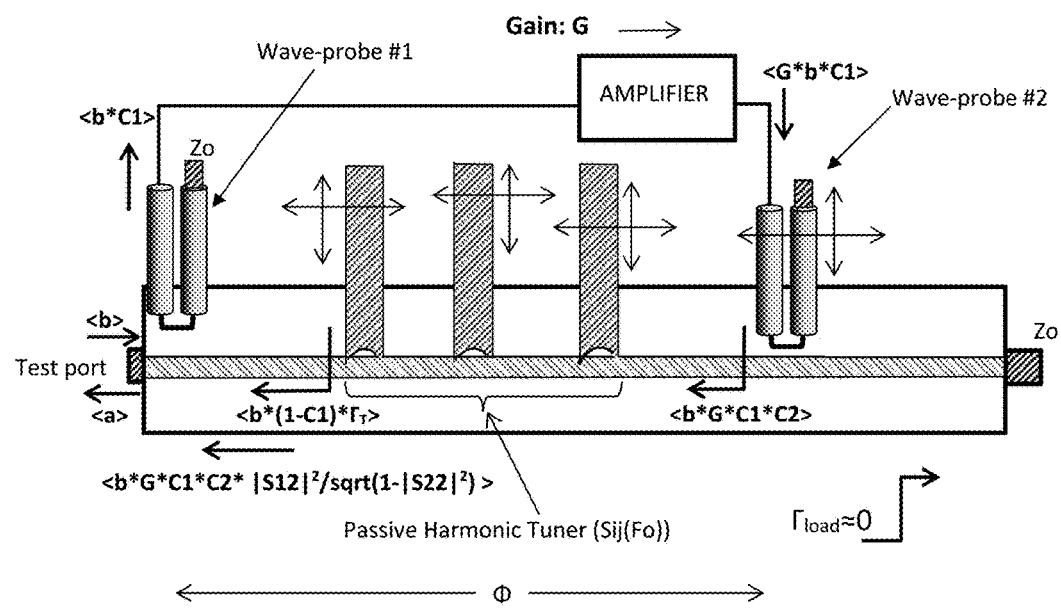
FIG. 9 depicts schematic signal flow and simplified signal interaction and relations in a three-probe integrated hybrid harmonic tuner. All representations concern fundamental frequency Fo only; harmonic impedances at 2Fo and 3Fo are tunable simultaneously and independently by the passive tuner as well.
Figure 10:
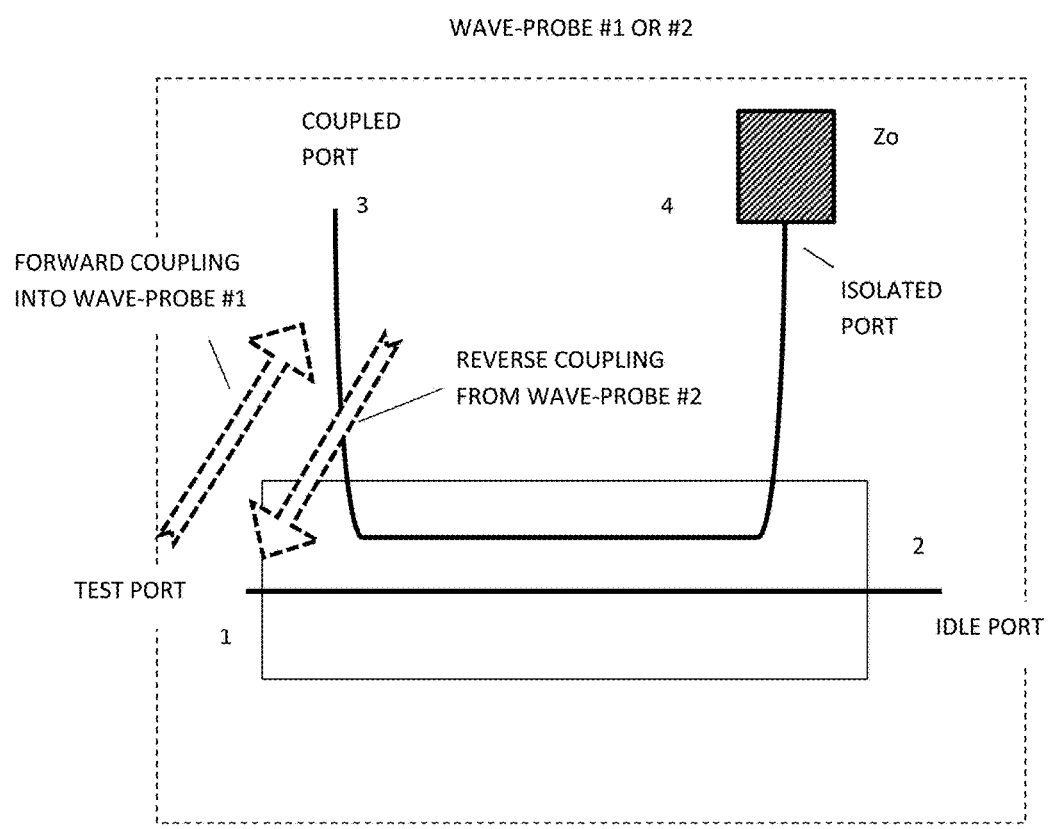
FIG. 10 depicts definitions of forward and reverse coupling in directional couplers, such as wave-probes.

The actual simplified signal wave relations at Fo are shown in FIG. 9. If the passive tuner includes more than one tuning probe (FIG. 7B or 7C) tuning is possible also at 2Fo and 3Fo. In either case the relations below concern only Fo: The DUT creates an output signal wave <b>. Part of it (<C1*b>), whereby C1<<1) is injected into the amplifier having gain G, and is extracted from the amplifier, amplified to (<C1*b*G>). This signal is then reverse (see FIG. 10) re-injected into the slabline: <C1*b*G*C2>, whereby C2<1, and C2>C1 and is available at the DUT port, after traversing the passive tuner and attenuated by the available tuner loss, as <C1*b*G*C2*|S12|²/sqrt(1−|S22|²)>. Hereby, for simplification and assuming we only deal with the output port of the DUT, we replace <a2> and <b2> in FIG. 8 with <a> and <b>; Sij are the s-parameters of the passive tuner at Fo. To this re-injected active signal wave is added the primary signal reflected at the passive tuner <b*(1−C1)*Γ$_T$>, and by consequence <a> becomes the hybrid vector sum of both the active and passive signal power wave vectors; the simplified optimum (i.e. with the vectors lined up) overall load reflection factor seen by the DUT at Fo then becomes $$\Gamma_{Load} = <a>/<b> = <C1*G*C2*|S12|^2/\text{sqrt}(1-|S22|^2)> + (1-C_1)*\Gamma_T>.$$

Figure 3:
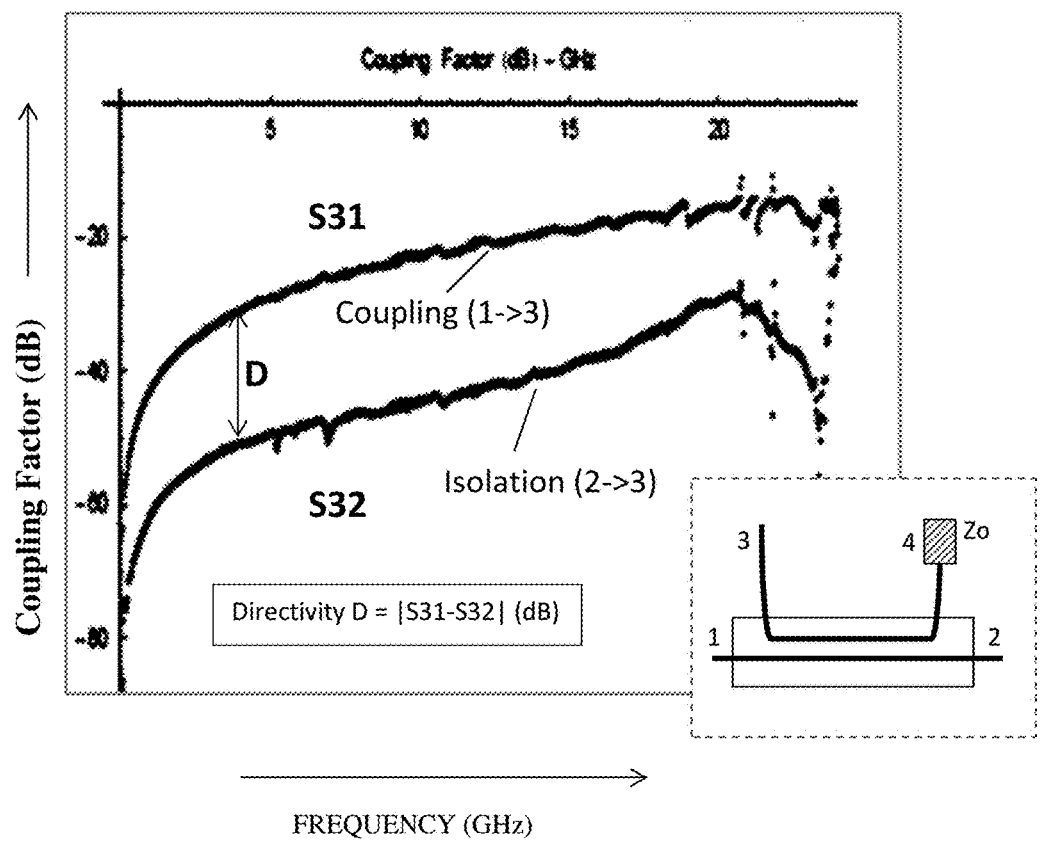
FIG. 3 depicts prior art, measurement of forward and reverse coupling of a signal coupler (wave-probe) as a function of frequency, as depicted in FIG. 2.

Hereby Sij, {i,j}={1,2} are the scattering (s-) parameters of the entire tuning section at the fundamental frequency Fo. The simplifications used here include neglecting reverse coupling loss into the isolated port of wave-probe #1 (coupling factor S42 of wave-probe #1) in FIGS. 3 and 10, phase offsets and multiple reflections along the slabline. Because the impedance of the slabline, looking into the output wave-probe #2, and the output load Zo are close to 50Ω (Γ≈0), then Γ$_T$≈S11, whereby S11 is the input reflection factor of a two-port (in this case a tuner) terminated with Zo and Sij are the passive two-port (tuner) s-parameters at Fo. Exact calculations are complex, but would not add much to the basic understanding of the tuning mechanism. In real life, the actual signal waves and reflections must be measured on-line as shown in FIG. 8. However, the above relation already shows that $\Gamma_{Load}$ can be manipulated using coupling factors C1 and C2, gain G and passive tuning $\Gamma_T$ and can, by proper choice of those parameters, create $|\Gamma_{Load}| \geq 1$, which is the objective of the invention.

Hybrid tuners cannot be fully pre-calibrated, i.e. their s-parameters cannot be measured, saved, recalled and used for final tuning under varying power test conditions, because the power amplifier may become nonlinear and compress causing a Gain change and/or a phase distortion, in which case the prior calibration, made at lower, small signal, power level, is lost. Such tuners shall be used in load pull test systems with on-line wave measurement capability (see ref. 8) only. A pre-calibration only serves to roughly place the tuner in a target tuning state, followed by an "on-line" iterative tuning search algorithm. FIG. 8 depicts such a load pull test system using hybrid harmonic tuner. The 4 port network analyzer is harmonic receiver: it measures injected and reflected power waves a1, b1, a2, b2 through the two couplers and, using proper calibration, corrects them back to the DUT reference plane. Fundamental and harmonic power waves, power, gain and impedances presented to the DUT can be measured, associated and saved with the DUT characteristics in load pull data files.

In typical load pull tuning operations, single frequency or harmonic multi-frequency tuning, the tuning itself is performed by the passive tuner section. The active tuner section and feedback signal injection through the mobile wave-probe is "statically" adjusted to point the re-injected feedback power wave vector <b*G*C1*C2>, shown in FIG. 9, to the direction of the conjugate complex internal reflection factor (impedance) of the DUT, vector-added to the passive reflection vector and help compensating for insertion loss of interconnections and cables and any limited tuning range and available loss (AvLoss=(1−|S22|²)/|S21|²) of the passive tuner. Therefore in simplified embodiments of the present invention, and without critical loss of operability or validity, the mobile wave-probe does not have to be fully automated, it can be partly or fully manually controlled. In a first alternative embodiment the actual phase of wave-probe #2 is manually adjustable through the horizontal position of the carriage; in a second alternative embodiment it is manually coupling-adjustable, through the vertical penetration of the wave-probe into the slabline and its proximity to the center conductor but horizontally (phase) motorized; in a third embodiment both phase and coupling are manually controlled. In the first two cases we have a semi-automated phase or amplitude reverse coupling, in the last case we have a fully manual one.

Obvious alternative embodiments of the concept of combining active feedback power injection with passive harmonic tuners to create a hybrid harmonic tuner are imaginable but shall not impede on the originality of the present invention.

What I claim as my invention is:

1. A RF hybrid (active-passive) impedance tuner comprising
   a) an active tuner section and
   b) a passive tuner section,
   both said tuner sections using a low loss slotted airline (slabline) as common transmission line, said slabline having an input (test) and an output (idle) port, a center conductor and two conductive side walls,
   and wherein
   a) the active tuner section comprises
      i) a fixed forward (away from the test port) coupling directional coupler (wave-probe #1), mounted on the slabline closest to the test port,
      ii) an adjustable reverse (towards the test port) coupling directional coupler (wave-probe #2), controlled by a mobile carriage #2 sliding along the slabline closest to the idle port,
      iii) each wave-probe having coupling and isolation ports and being inserted into the slot of the slabline;
      iv) a power amplifier having an input port and an output port, and
      v) characteristic impedance (Zo) terminations;
   b) the passive tuner section comprises
      at least one mobile carriage #1 sliding horizontally along the axis of the slabline, between wave-probe #1 and mobile carriage #2,
   wherein
      all mobile carriages have at least one vertically movable axis, carriage #2 carrying wave-probe #2 on its vertical axis and all other carriages carrying reflective tuning probes on their vertical axes, said tuning probes being insertable into the slot of the slabline and capacitively coupled to the center conductor;
   wherein
      the forward coupled port of wave-probe #1 is connected to the input port of the amplifier and the output port of the amplifier is connected to the reverse coupled port of wave-probe #2;
   and wherein
      the isolated ports of wave-probes #1 and #2 are terminated with characteristic impedance Zo.

2. The hybrid tuner as in claim 1, wherein
   the passive tuner section comprises two mobile carriages #1 and #3, each having at least one vertically movable axis, each axis carrying a reflective tuning probe, whereby said probe is insertable into the slot of the slabline and capacitively coupled to the center conductor;
   and wherein
      carriage #1 is closest to the test port, carriage #2 is closest to the idle port and carriage #3 is inserted between carriage #1 and carriage #2.

3. The hybrid tuner as in claim 1,
   wherein
      the passive tuner section comprises three mobile carriages #1, #3 and #4, each having at least one vertically movable axis, each axis carrying a reflective tuning probe, whereby said probe is insertable into the slot of the slabline and capacitively coupled to the center conductor,
   and wherein
      carriage #1 is closest to the test port, carriage #2 is closest to the idle port and carriages #3 and #4 are inserted between carriage #1 and carriage #2.

4. The hybrid tuner as in claim 1 or 2 or 3,
   wherein
      wave-probe #2 is mounted on the vertical axis of mobile carriage #2, and is insertable into the slot of the slabline at adjustable proximity to the center conductor.

5. The hybrid tuner as in claim 4, wherein
   the horizontal movement of all carriages and the movement of their vertical axes are remotely controlled using stepper motors, appropriate gear, control electronics and control software.

6. The hybrid tuner as in claim 4, wherein
   the horizontal movement and vertical axis movements of all carriages which carry tuning probes are remotely controlled using stepper motors, appropriate gear, control electronics and control software;
   and wherein
      the horizontal movement of carriage #2 and the vertical movement of the vertical axis of carriage #2, which said axis is carrying wave-probe #2, are manually controlled using micrometric screws and gear.

7. The hybrid tuner as in claim 4, wherein the horizontal and vertical axis movements of all carriages carrying tuning probes and the horizontal movement of carriage #2, which is carrying wave-probe #2, are remotely controlled using stepper motors, appropriate gear, control electronics and control software;

and wherein the vertical axis movement of carriage #2, which said axis is carrying wave-probe #2, is manually controlled using micrometric screw and gear.

\* \* \* \* \*